(12) United States Patent
Hasnain

(10) Patent No.: US 7,741,134 B2
(45) Date of Patent: Jun. 22, 2010

(54) INVERTED LED STRUCTURE WITH IMPROVED LIGHT EXTRACTION

(75) Inventor: Ghulam Hasnain, Palo Alto, CA (US)

(73) Assignee: Bridgelux, Inc., Livermore, CA (US)

( * ) Notice: Subject to any disclaimer, the term of this patent is extended or adjusted under 35 U.S.C. 154(b) by 103 days.

(21) Appl. No.: 12/210,845

(22) Filed: Sep. 15, 2008

(65) Prior Publication Data

US 2010/0065866 A1    Mar. 18, 2010

(51) Int. Cl.
*H01L 21/02* (2006.01)
(52) U.S. Cl. .............................. 438/22; 438/25; 438/27; 438/29; 438/32; 438/42; 257/E33.068; 257/E33.074
(58) Field of Classification Search ............. 438/22–42; 257/E33.068–E33.074
See application file for complete search history.

(56) References Cited

U.S. PATENT DOCUMENTS

| | | | | |
|---|---|---|---|---|
| 5,396,350 A * | 3/1995 | Beeson et al. | ................. | 349/62 |
| 5,598,281 A * | 1/1997 | Zimmerman et al. | ........... | 349/5 |
| 5,779,924 A * | 7/1998 | Krames et al. | ................ | 216/24 |
| 6,512,600 B1 * | 1/2003 | Kawai et al. | ................ | 358/475 |
| 6,831,302 B2 * | 12/2004 | Erchak et al. | .................. | 257/87 |
| 7,012,279 B2 * | 3/2006 | Wierer, Jr. et al. | ............. | 257/94 |
| 7,048,385 B2 * | 5/2006 | Beeson et al. | ................. | 353/97 |
| 7,048,428 B2 * | 5/2006 | Tahara et al. | ................ | 362/626 |
| 7,053,420 B2 * | 5/2006 | Tadatomo et al. | ............. | 257/98 |
| 7,102,162 B2 * | 9/2006 | Mai | ............................ | 257/59 |
| 7,128,460 B2 * | 10/2006 | Hosobuchi | .................. | 362/626 |
| 7,165,874 B2 * | 1/2007 | Nagakubo et al. | ........... | 362/623 |
| 7,490,971 B2 * | 2/2009 | Iwasaki | ...................... | 362/628 |
| 7,492,459 B2 * | 2/2009 | Takata et al. | ................ | 356/445 |
| 7,589,355 B2 * | 9/2009 | Tomoda et al. | ................ | 257/98 |
| 2004/0084682 A1 * | 5/2004 | Illek et al. | ..................... | 257/80 |
| 2006/0273334 A1 | 12/2006 | Nagai et al. | .................. | 257/95 |

FOREIGN PATENT DOCUMENTS

KR    10-2006-0055739 A    5/2006

OTHER PUBLICATIONS

PCT Search Report and Written Opinion, Mar. 16, 2010 in PCT/US2009/054537.

* cited by examiner

*Primary Examiner*—Michael S Lebentritt
(74) *Attorney, Agent, or Firm*—Calvin B. Ward

(57) ABSTRACT

A light source and method for fabricating the same are disclosed. The light source includes a substrate and a light emitting structure. The substrate has a first surface and a second surface, the second surface including a curved, convex surface with respect to the first surface of the substrate. The light emitting structure includes a first layer of a material of a first conductivity type overlying the first surface, an active layer overlying the first layer, the active layer generating light when holes and electrons recombine therein, and a second layer includes a material of a second conductivity type overlying the active layer and a second surface opposite to the first surface. A mirror layer overlies the light emitting structure.

3 Claims, 6 Drawing Sheets

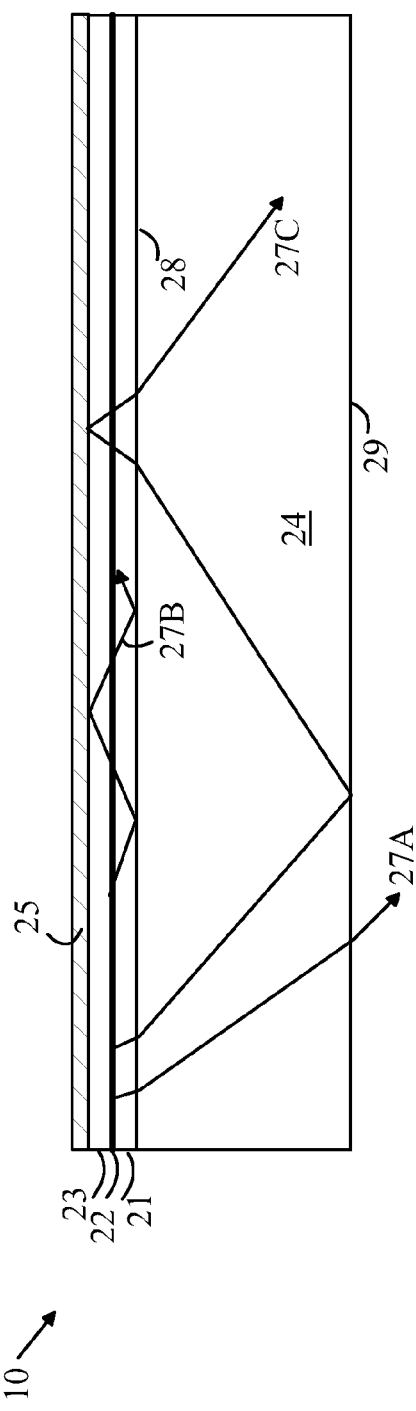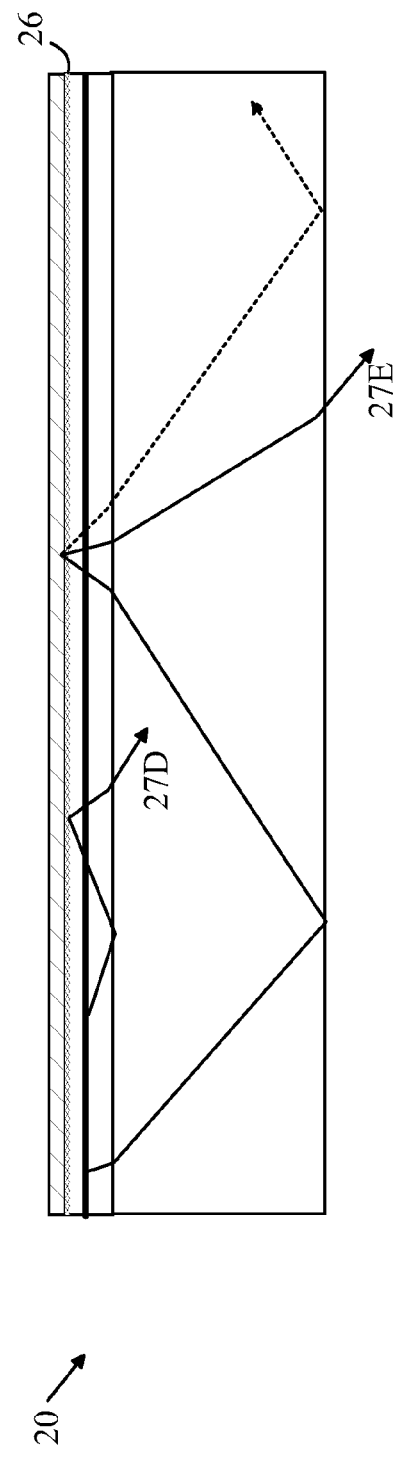

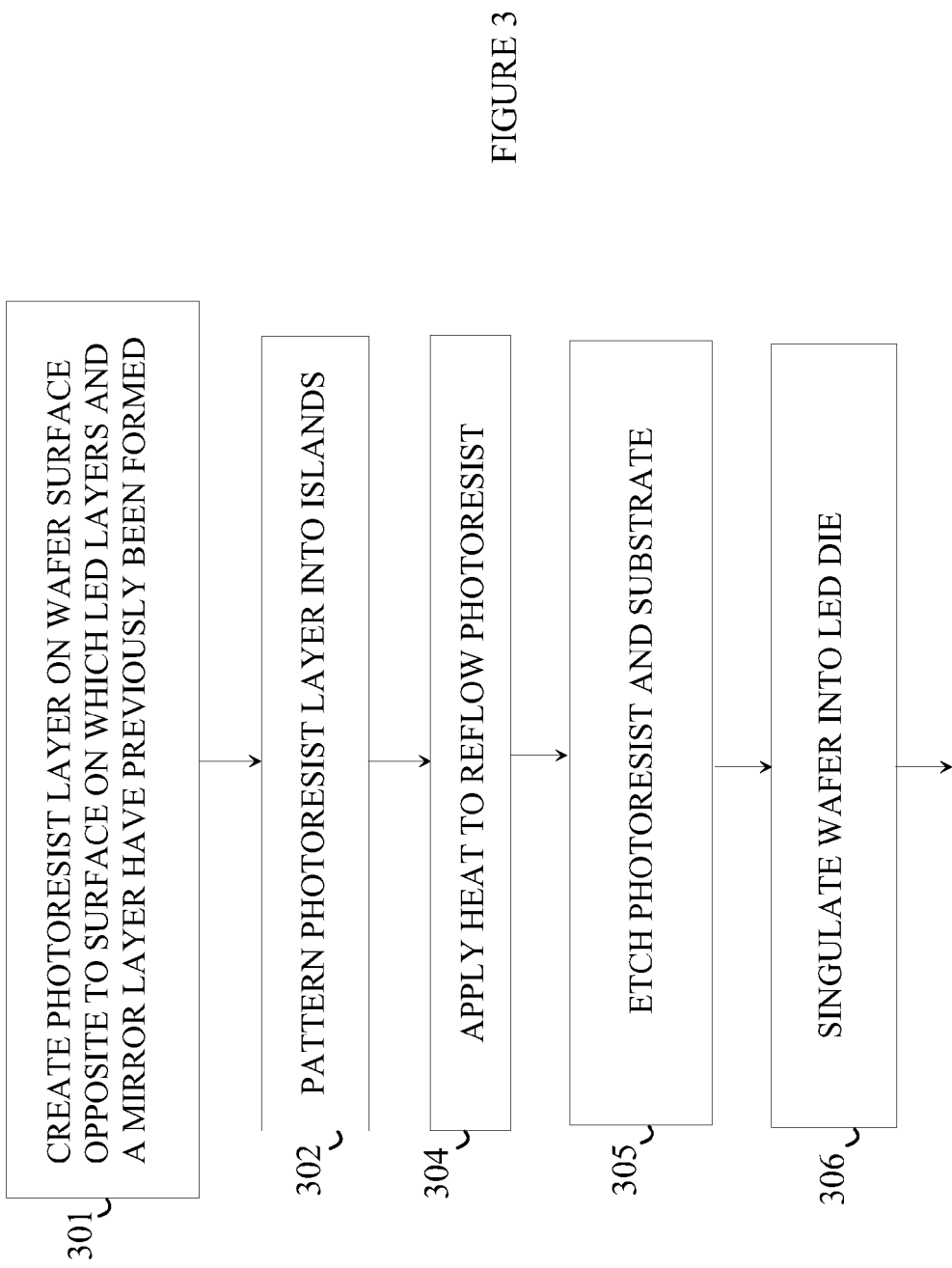

INVERTED LED STRUCTURE WITH IMPROVED LIGHT EXTRACTION

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

The cost and conversion efficiency of LEDs are important factors in determining the rate at which this new technology will replace conventional light sources and be utilized in high power applications. Many high power applications require multiple LEDs to achieve the needed power levels, since individual LEDs are limited to a few watts. In addition, LEDs generate light in relatively narrow spectral bands. Hence, in applications requiring a light source of a particular color, the light from a number of LEDs with spectral emission in different optical bands is combined. Thus, the cost of many light sources based on LEDs is many times the cost of the individual LEDs.

The conversion efficiency of individual LEDs is an important factor in addressing the cost of high power LED light sources. The conversion efficiency of an LED is defined to be the ratio of optical power emitted by the LED to the electrical power dissipated. Electrical power that is not converted to light in the LED is converted to heat that raises the temperature of the LED. Heat dissipation places a limit on the power level at which an LED operates. In addition, the LEDs must be mounted on structures that provide heat dissipation, which, in turn, further increases the cost of the light sources. Thus, if the conversion efficiency of an LED can be increased, the maximum amount of light that can be provided by a single LED can also be increased, and hence, the number of LEDs needed for a given light source can be reduced. In addition, the cost of operation of the LED is also inversely proportional to the conversion efficiency. Hence, there has been a great deal of work directed to improving the conversion efficiency of LEDs.

For the purposes of this discussion, an LED can be viewed as having three layers, the active layer sandwiched between two other layers that form a p-i-n diode structure. These layers are typically deposited on a substrate such as sapphire. It should be noted that each of these layers typically includes a number of sub-layers.

Improvements in materials have led to improvements in the efficiency of light generated in the active layer. GaN based LEDs have shown particular promise in terms of increased light conversion efficiency with respect to the active layer. Unfortunately, these materials have a very high index of refraction, and hence, light may be trapped within the LED due to internal reflection at the air-LED boundary or other boundaries at which light traveling in a material of high index of refraction encounters a material of a lower index of refraction. A significant fraction of the trapped light is lost due to absorption in the GaN materials. In the case of conventional GaN-based LEDs on sapphire substrates, approximately 70% of the light emitted by the active layer remains trapped within the LED unless the simple planar layer LED structure is altered.

Several techniques have been described to improve light extraction from LEDs by minimizing this type of internal trapping. One class of techniques operates by randomizing the angles with which light rays that strike an internally reflecting boundary are reflected from that boundary. If an LED is constructed from parallel planar layers, a ray that strikes a first boundary at an angle greater than the critical angle at an interface between two layers of different indices of refraction will be reflected internally toward a second boundary. This ray will strike the second boundary at the same angle at which the ray struck the first boundary, and hence, be reflected back toward the first boundary at the same angle. Hence, the ray is trapped between the boundaries and will either eventually be absorbed by the materials or exit through a side surface of the LED. By roughening one of the boundaries, the correlation between the angle at which a ray strikes a boundary on a first reflection and the angle at which that ray strikes that boundary on a second reflection is significantly reduced, or eliminated. Hence, each time a ray strikes a boundary, the ray has a finite chance of escaping even if that ray was reflected internally at the previous reflection of that ray.

However, there are limits on the degree of roughening that can be achieved without introducing other problems that impact the efficiency of the LED through other mechanisms. The degree of roughening that can be obtained though shaping of the top surface of the LED is limited by the thickness of the p-layer, which is usually the layer that is exposed after the layers are fabricated. The p-layer material has a significantly higher growth temperature, and hence, the thickness of this layer must be held to a minimum during epitaxial growth to prevent degradation of the underlying active layer. However, the layer must be thick enough to allow the layer to be roughened sufficiently to scatter light that strikes the layer. The scattering structures must have dimensions that are of the order of the wavelength of the light that is being scattered to provide efficient scattering. Hence, the p-layer must have a thickness that can be roughened to provide features of the order of the wavelength of the light generated in the active layer and still remain intact. This trade-off limits the degree to which the internal reflection problem can be addressed by roughening the surface of the LED.

Another set of techniques that addresses the issue of light trapping involves providing a curved surface at the face of the LED through which light exits. If the curved surface is large compared to the LED, light leaving the LED at any angle will encounter the surface at an angle less than the critical angle and escape. This solution is typically applied at the packaging level by covering the LED with a layer of material that has a convex surface. The layer of material, however, is constructed from a material that has an index of refraction that is significantly less than that of the GaN layers from which the LED is constructed. Hence, while light that is emitted into this interface layer escapes with high efficiency, light is still trapped in the LED due to internal reflections at the boundary of the interface layer and the LED.

In addition, this solution requires a surface that is much larger than the LED, and hence, increases the size of the light source. Furthermore, the interface structure complicates the packaging of the LED in that it requires the light source manufacturer to mold the interface structure as part of the packaging operation.

SUMMARY OF THE INVENTION

The present invention includes a light source and method for fabricating the same. The light source includes a substrate and a light emitting structure. The substrate has a first surface and a second surface, the second surface including a curved, convex surface with respect to the first surface of the substrate. The light emitting structure includes a first layer of a material of a first conductivity type overlying the first surface, an active layer overlying the first layer, the active layer generating light when holes and electrons recombine therein, and a second layer that includes a material of a second conductivity type overlying the active layer and a second surface opposite to the first surface. A mirror layer overlies the light emitting structure.

In one aspect of the invention, the curved convex surface is chosen such that a light ray generated in the active layer that is initially reflected from the surface due to internal reflection subsequently strikes the curved convex surface at an angle that is less than the critical angle to the surface at that point on the surface.

In another aspect of the invention, the curved convex surface is created by patterning a photoresist layer on said substrate in which the photoresist layer has a surface profile that is similar to said curved convex surface. The photoresist layer and substrate are then etched using an etching system that attacks both surfaces.

BRIEF DESCRIPTION OF THE DRAWINGS

FIGS. 1A and 1B are simplified cross-sectional views of a prior art GaN-based inverted LED structure.

FIG. 3 is a flow chart for a fabrication method according to the present invention.

DETAILED DESCRIPTION OF THE PREFERRED EMBODIMENTS OF THE INVENTION

Figure 2:
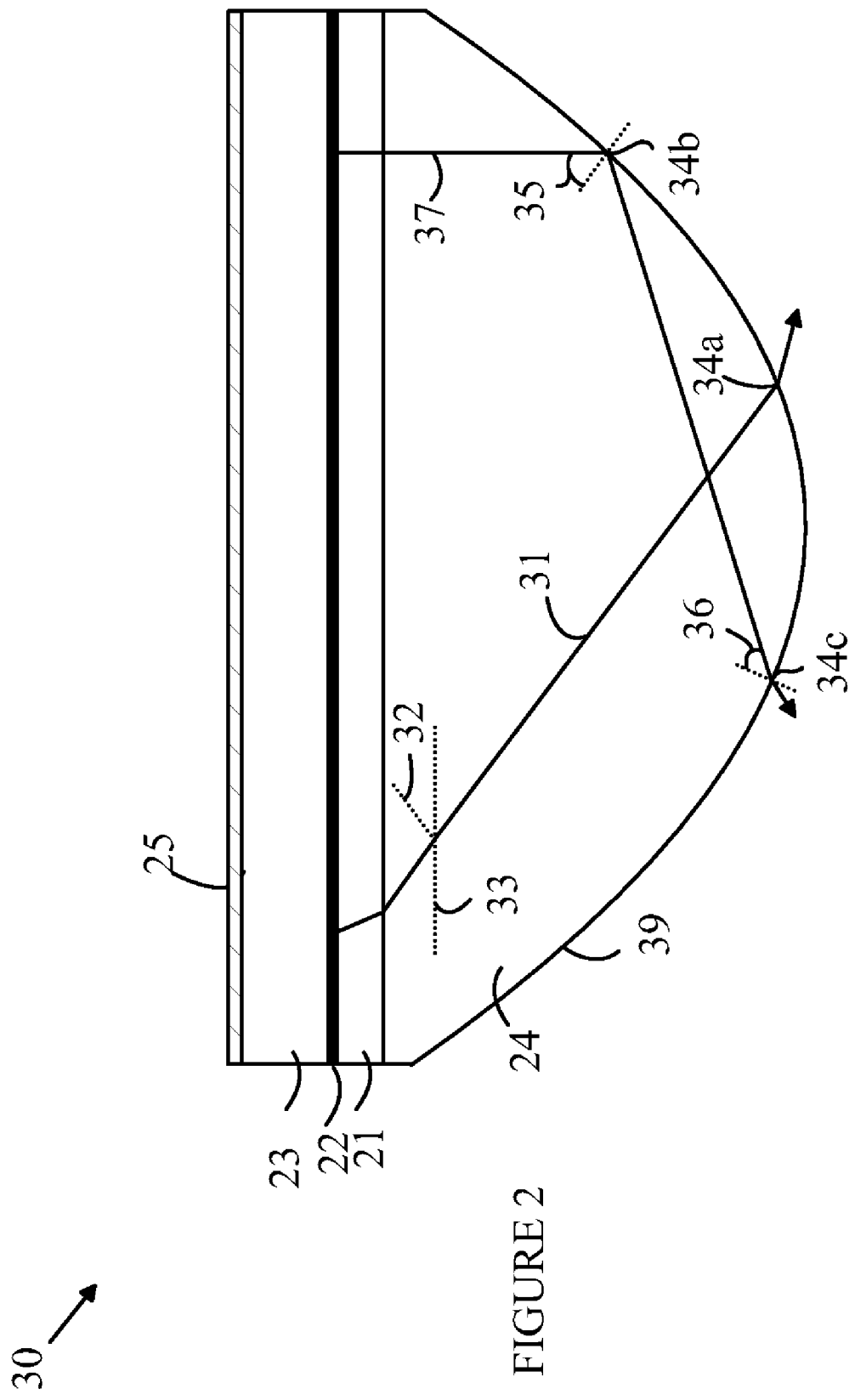
FIG. 2 is a simplified cross-sectional view of part of a wafer including an LED 30 according to one aspect of the current invention.

The manner in which the present invention provides its advantages can be more easily understood with reference to FIGS. 1A and 1B, which are simplified cross-sectional views of a prior art GaN-based inverted LED structure. LED 10 is constructed by growing three layers on a sapphire substrate 24. The first layer 21 is an n-type GaN material. The second layer is a p-type GaN layer 23. The third layer 22 is an active layer that emits light when holes and electrons from layers 21 and 23 combine therein. Each of these layers may include a number of sub-layers. Since the functions of these sub-layers are well known in the art and are not central to the present discussion, the details of these sub-layers have been omitted from the drawings and the following discussion.

Light that is generated in layer 22 leaves layer 22 at all possible angles. An example of light that successfully leaves the LED after passing through boundaries 28 and 29 is shown at 27A. Some of the light leaving layer 22, as shown at 27B in FIG. 1A, encounters boundary 28 between LED layer 21 and substrate 24 at a large enough angle to suffer total internal reflection, and becomes trapped between boundary 28 and mirror 25. Another portion of the light leaving layer 22, as shown at 27C in FIG. 1A, encounters boundary 28 at an angle below the critical angle for that boundary and passes through it, but then encounters boundary 29 between substrate 24 and air at a large enough angle to suffer total internal reflection, and becomes trapped between boundary 29 and mirror 25.

Light becomes trapped between two boundaries because there is a correlation between the angle at which light strikes a boundary in subsequent reflections and the angle at which light struck that boundary during the first reflection. For example, if light is reflected from boundary 29 because the light strikes the boundary at an angle greater than the critical angle, that light will be directed back to mirror 25 and will then be reflected back to boundary 29. Since the boundaries are parallel, this light will again strike boundary 29 at the same angle that the light struck boundary 29 in the previous encounter with that boundary. Hence, the light will again be reflected by boundary 29. Hence, the light becomes trapped between the two boundaries and is either absorbed in the material of the LED or exits at the end of the LED.

The amount of light that is trapped between mirror 25 and either boundary 28 or 29 can be reduced by providing a rough surface 26, as shown in FIG. 1B. LED 20 is constructed in a manner similar to LED 10 except that the top surface of layer 23 has been roughed by etching as shown at 26. Rough surface 26 randomizes the angles at which light incident on surface 26 subsequently strikes boundaries 28 and 29. Consider boundary 28. Light that strikes boundary 28 at an angle greater than the critical angle will be reflected back toward mirror 25. The rough surface randomizes the angle at which that light leaves mirror 25. That is, there will be a spread in the angles of reflection of the light striking mirror 25. Hence, some fraction of the light leaving mirror 25 will now strike boundary 28 at an angle less than the critical angle and pass through the boundary as shown at 27D and 27E. The remaining light will again be directed to mirror 25 and reflected over a range of angles back toward boundary 29. Hence, rough surface 26 improves the extraction efficiency of the LED in the prior art structure of FIG. 1B.

While roughening the surface of layer 23 improves the light extraction efficiency of LED 20 relative to LED 10, the roughening leads to other problems. First, the mirror is typically formed by depositing a layer of a metal such as silver or aluminum on the top surface of layer 23. If the top surface of layer 23 is rough, the reflectivity of the mirror is substantially reduced due to surface plasmon effects. Hence, a substantial fraction of the light is lost.

Second, the amount of surface roughening that can be provided through shaping of the top surface is limited by the thickness of layer 23. Layer 23 is typically the p-type semiconductor layer. For many semiconductor material systems such as GaN, the p-type material has a very high resistivity. In addition, this p-GaN layer requires significantly higher growth temperature than that of the underlying active layers. To minimize degradation of the active layer, the thickness of the p-GaN layer is chosen to be as small as possible. To provide adequate roughening, the layer must have a thickness that provides scattering features that are of the order of the wavelength of the light generated in the active layer while still providing an intact continuous layer. Hence, there is a tradeoff between internal quantum efficiency and light scattering efficiency.

The present invention is based on the observation that, even in the absence of roughening surface 23, the amount of light that is trapped between mirror 25 and surface 29 shown in FIGS. 1A and 1B can be reduced by altering the shape of surface 29 such that the angle of incidence, with respect to the normal, to a surface of a ray striking the surface in a subsequent encounter is less than the angle of incidence with which the ray struck the surface in a previous reflection, and hence, the light can escape.

Refer now to FIG. 2, which is a simplified cross-sectional view of part of a wafer including an LED 30 according to one aspect of the current invention. LED 30 is constructed by depositing layers 21-23 on substrate 24, and depositing a mirror layer 25, in a manner analogous to that described above with respect to LED 20, but without necessarily including any rough surface. The bottom surface 39 of substrate 24 has a convex curvature. Consider ray 31. If the bottom surface of substrate 24 were flat as shown at 33, ray 31 would have been reflected back into layer 21 as shown at 32. Instead, ray 31 strikes the curved surface of substrate 39 at point 34a. The curvature of substrate 24 at this point results in an angle of incidence of ray 31 that is less than the critical angle, and hence, ray 31 escapes.

Now consider ray 37 which leaves active layer 22 at normal incidence to layers 22 and 21. This ray would normally escape from an LED with a planar surface that is parallel to layer 21. However, ray 37 strikes surface 39 at an angle 35 that is greater than the critical angle at point 34b, and hence, is reflected and strikes surface 39 at point 34c. Surface 39 is chosen such that the angle of incidence 36 at which this ray strikes surface 39 is greater than angle 35, and hence, this ray also escapes from substrate 24.

In general, surface 39 is chosen such that a ray that is initially reflected from surface 39 due to internal reflection subsequently strikes surface 39 at an angle that is less than the critical angle to surface 39 at that point on surface 39. The reflection at which escape occurs may be the next reflection or a reflection that takes place after a number of reflections from surface 39 and/or the other surfaces of LED 30 such as mirror 25 or the end surfaces of layers 21-23. In one aspect of the present invention, surface 39 is a non-spherical convex surface. For example, surface 39 could be an approximately parabolic surface.

Figure 4A:
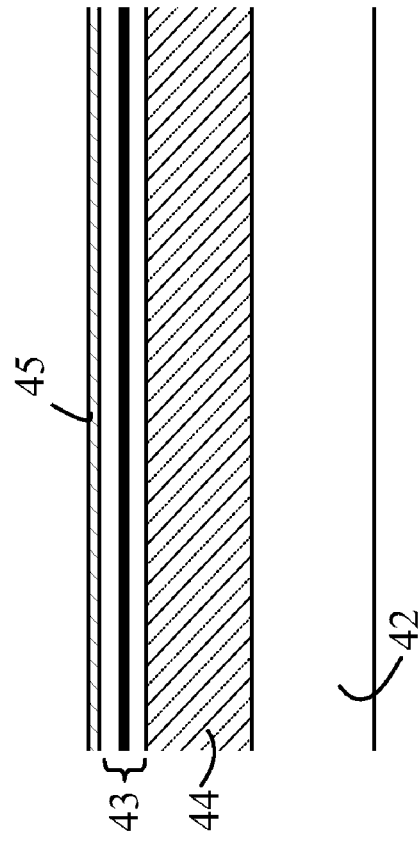
FIGS. 4A-4F are cross-sectional views of a portion of a wafer at various points in the fabrication process.
Figure 4B:
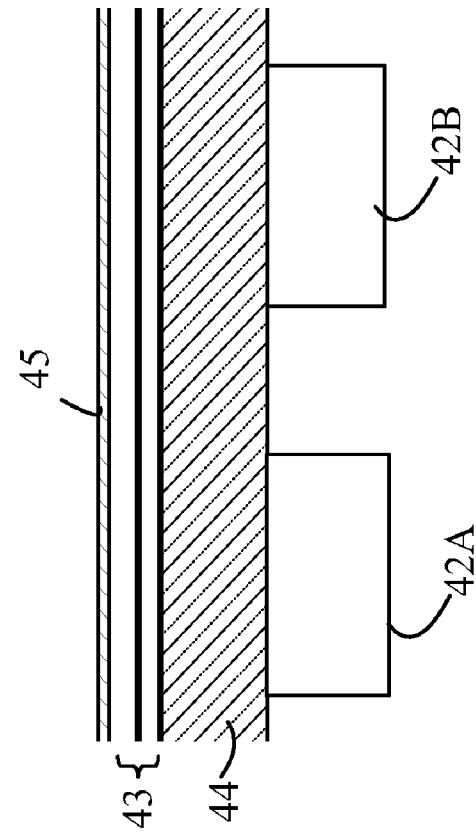

Refer now to FIGS. 3 and 4A-4F, which illustrate one method of fabricating an LED according to the present invention. FIG. 3 is a flow chart for the method, and FIGS. 4A-4F are cross-sectional views of a portion of a wafer at various points in the fabrication process. The process starts with the deposition of the conventional three-layer LED structure 43 on a sapphire substrate 44. The top layer of structure 43 is covered with a mirror layer 45 and then a layer of photoresist is deposited on substrate 42 as shown in FIG. 4A and step 301. At step 302, shown in FIG. 4B, the photoresist layer is patterned to create islands 42A and 42B, at positions corresponding to the desired convex structures. In the portion of the wafer shown, two structures are to be formed, one for each of two adjacent LEDs.

Figure 4C:
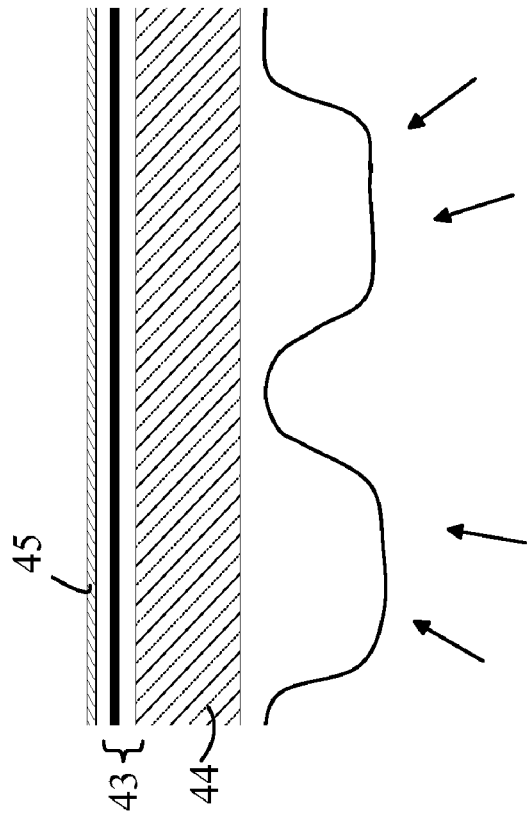
Figure 4D:
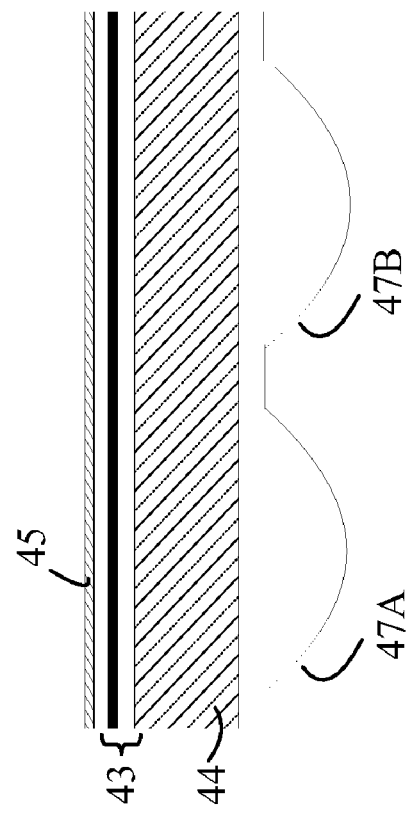

At step 304, shown in FIG. 4C, heat is applied, to allow the photoresist to soften and flow. After the heat is removed, surface tension forces cause a reshaping of the photoresist islands. If the photoresist islands are allowed to become completely molten, a substantially convex surface is formed at each island as shown at 47A and 47B in FIG. 4D. The magnitude and temporal profile of the heat application may be chosen to achieve a particular desired surface profile.

Figure 4E:
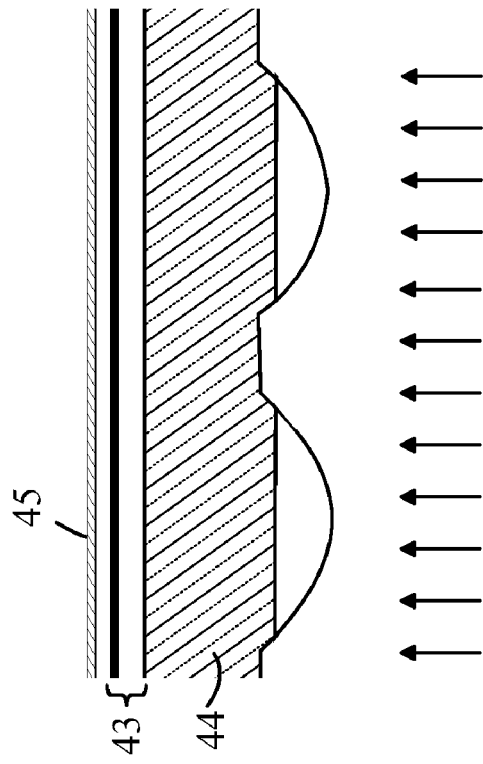
Figure 4F:
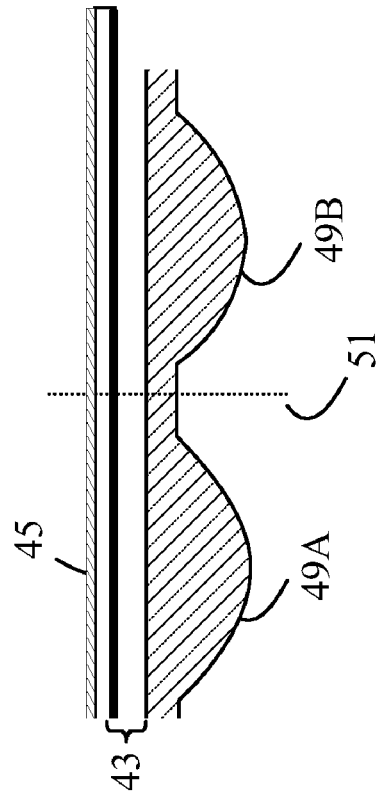

The photoresist pattern is then transferred to the underlying substrate by etching the photoresist layer and underlying substrate as shown at step 305, and FIG. 4E. Ion beam milling can be utilized for the etching process. Those portions of substrate 44 that are covered by photoresist are not etched until the overlying photoresist layer has been removed by the ion beam. Hence, convex surface areas 49A and 49B remain at the end of the etching process as shown in FIG. 4F.

The height profile of the resulting structure in the substrate depends both on the profile of the photoresist and on the relative selectivity of the ion beam etching process. If the ion beam process etches the underlying substrate at substantially the same rate as the photoresist, the pattern in the photoresist will be transferred to the substrate such that the convex sections have substantially the same height as the corresponding structures in the photoresist layer. If the ion beam etch attacks the photoresist more rapidly than the substrate, a pattern having the same shape, but with a reduced height will be created.

The generation of the convex structures is performed at the wafer scale, and hence, does not substantially increase the cost of the LEDs. In this regard, it should be noted that the substrate is often thinned in conventional processing systems to facilitate the separation of the wafer into individual dies. In the case of a sapphire substrate, the dies are separated by scoring the wafer at the desired locations and then breaking the wafer. To provide reliable separation, the wafer is typically thinned to a thickness of about 100 microns prior to the scribing and breaking process shown at 306 in FIG. 3. Since the wafer will be scribed at the locations between the dies, i.e., the areas in which the convex structure has the least vertical thickness as shown at 51 in FIG. 4F, no additional thinning is needed to separate the dies.

In the above-described embodiments, the convex structure is fabricated at or near the end of the wafer processing that produces the final LEDs. However, embodiments in which the convex light extraction structures are fabricated before the deposition of the LED layers could also be constructed. In this case, the entity that provides the wafers would provide wafers with the light extraction features already in place. The LED manufacturer would only need to generate the LED related structures in a manner that is properly aligned with the convex structures. As the wafers will be thinner during the conventional processing, the wafers can be bonded to a carrier that provides the requisite resistance to breaking during processing.

It should be noted that the convex light extraction surface is constructed from the substrate, and hence, has the same index of refraction. Thus no new interfaces between layers having different indices of refraction are created. Prior art schemes that utilize a convex surface for extracting light rely on coupling large convex lenses to the LED and typically utilize materials with substantially lower indices of refraction than sapphire or the materials from which the LED layers are constructed. To be effective, the lens must be located at some distance from the LED and be several times larger in diameter than the LED. As a result, the lens must be individually created or attached at the packaging stage of the light source assembly. This increases the cost of the resultant light sources.

It should also be noted that the lens must have a diameter that is many times that of the LED, and must be placed some distance from the LED so that any ray that leaves the LED strikes the curved surface at an angle that is less than the critical angle. This places a lower limit on the size of the light source that is unsatisfactory for some applications.

In addition, the space between the LED and the curved surface is filled with a material with a relatively low index of refraction compared to the LED layers. This results in a planar boundary between the LED and the light extraction lens in which the boundary separates two regions of different indices of refraction. Hence, some of the light will be reflected at this boundary back into the LED.

The present invention is particularly useful for LEDs constructed from the GaN family of materials and other material systems having high indices of refraction such as Sapphire or Silicon Carbide. For the purposes of the present discussion, the GaN family of materials will be defined to be AlGaN, InGaN and GaN. However, the present invention may be applied to LEDs constructed from other families of materials.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent to those skilled in the art from the foregoing description and accompanying drawings. Accordingly, the present invention is to be limited solely by the scope of the following claims.

What is claimed is:

1. A method of fabricating a light emitting device comprising:
   providing a substrate having a first surface and a second surface that are substantially parallel to one another;
   fabricating a light emitting structure on said first surface, said light emitting structure comprising:
   a first layer of semiconductor material of a first conductivity type deposited on said substrate;
   an active layer overlying said first layer; and
   a second layer of semiconductor material of an opposite conductivity type from said first conductivity type overlying said active layer; and
   etching said second surface of said substrate to provide a curved, convex surface with respect to said first surface, wherein said substrate comprises sapphire or silicon carbide.

2. A method of fabricating a light emitting device comprising
   providing a substrate having a first surface and a second surface that are substantially parallel to one another;
   fabricating a light emitting structure on said first surface, said light emitting structure comprising:
   a first layer of semiconductor material of a first conductivity type deposited on said substrate;
   an active layer overlying said first layer; and
   a second layer of semiconductor material of an opposite conductivity type from said first conductivity type overlying said active layer; and
   etching said second surface of said substrate to provide a curved, convex surface with respect to said first surface, wherein etching said second surface of said substrate comprises:
   depositing a layer of photoresist on said second surface;
   patterning said deposited photoresist layer;
   heating said photoresist to a temperature at which a surface of said photoresist layer assumes a curved convex shape; and
   etching said photoresist layer and said substrate.

3. The method of claim 1 wherein said curved convex surface is chosen such that a light ray generated in said active layer that is initially reflected from said curved convex surface due to internal reflection subsequently strikes said curved convex surface at an angle that is less than the critical angle to said surface at that point on said surface.

* * * * *